United States Patent [19]
Okazaki

[11] Patent Number: 5,990,500
[45] Date of Patent: Nov. 23, 1999

[54] NITRIDE COMPOUND SEMICONDUCTOR LIGHT EMITTING ELEMENT AND ITS MANUFACTURING METHOD

[75] Inventor: Haruhiko Okazaki, Minami-Ku, Japan

[73] Assignee: Kabushiki Kaisha Toshiba, Kanagawa-ken, Japan

[21] Appl. No.: 09/261,819

[22] Filed: Mar. 3, 1999

[30] Foreign Application Priority Data

Mar. 25, 1998 [JP] Japan .................................. 10-077477

[51] Int. Cl.⁶ .................................................. H01L 33/00
[52] U.S. Cl. .............................. 257/99; 257/94; 257/745; 257/748; 372/43
[58] Field of Search .............................. 257/94, 99, 745, 257/748

[56] References Cited

U.S. PATENT DOCUMENTS 5,740,192  4/1998  Hatano et al. ............................. 372/45
5,786,603  7/1998  Rennie et al. ............................. 257/13

FOREIGN PATENT DOCUMENTS 10-56206  2/1998  Japan .............................. H01L 33/00

*Primary Examiner*—Olik Chaudhuri
*Assistant Examiner*—Douglas A. Wille
*Attorney, Agent, or Firm*—Loeb & Loeb, LLP

[57] ABSTRACT

A nitride compound semiconductor light emitting element is made by stacking a metal layer made of one of elements: palladium (Pd), scandium (Sc), vanadium (V), zirconium (Zr), hafnium (Hf), tantalum (Ta), rhodium (Rh), iridium (Ir), cobalt (Co) and copper (Cu), and another metal layer made of one of elements: titanium (Ti), nickel (Ni), molybdenum (Mo), tungsten (W) and magnesium (Mg), to increase the adhesive strength of its electrodes with a semiconductor layer, reduce the contact resistance of the electrodes to improve the ohmic characteristics, and improve the external quantum efficiency by combination of thin-film metals with a transparent electrode.

12 Claims, 7 Drawing Sheets

NITRIDE COMPOUND SEMICONDUCTOR LIGHT EMITTING ELEMENT AND ITS MANUFACTURING METHOD

BACKGROUND OF THE INVENTION

1. Field of the Invention

This invention relates to a nitride compound semiconductor light emitting element and its manufacturing method. More specifically, the invention relates to a nitride compound semiconductor light emitting element made by stacking GaN, InGaN, GaAlN and/or other nitride compound semiconductor layers on a substrate and having an electrode with a high adhesive force and a low contact resistance, a manufacturing method thereof, and a light emitting device including same.

2. Description of the Related Art

Nitride compound semiconductors expressed by $Al_xGa_yIn_{1-x-y}N$ ($0 \leq x \leq 1$, $0 \leq y \leq 1$, $x+y \leq 1$) have been remarked for years as materials of light emitting diodes (LED) for ultraviolet light to blue or green light. Compound semiconductors of these materials have enabled intensive emission of ultraviolet light, blue light, green light, and so on, which was difficult before. These nitride compound semiconductors are usually grown on sapphire substrates which are insulating substrates. Therefore, unlike GaAs light emitting elements, electrodes cannot be made on bottom surfaces of substrates, and both anode and cathode electrode must be made on semiconductor layers stacked by crystalline growth.

Especially in case of semiconductor elements using nitride compound semiconductors in which sapphire substrates are translucent to emission wavelengths, they are usually mounted to orient the electrodes downward so as to take out light from the sides of the sapphire substrates.

FIG. 7 is a diagram schematically showing construction of an existing nitride compound semiconductor light emitting element. In the element, a GaN buffer layer 2, n-type GaN layer 3 and p-type GaN layer 4 are stacked on a sapphire substrate 1 by crystalline growth, and the p-type GaN layer 4 is partly removed by etching to expose the n-type GaN layer 3. The p-side electrode 15 is made on the p-type GaN layer 4, and the n-side electrode 14 is made on the n-type GaN layer 3. The light emitting element is mounted on a lead frame 17 by orienting the surface with the electrodes downward and using a conductive adhesive 16 such as silver paste.

In the existing semiconductor light emitting element shown in FIG. 7, light generated by injecting an electric current from the p-type GaN layer 4 to the n-type GaN layer 2 is reflected by the p-side electrode 15 and taken out through the sapphire substrate 1. However, the conductive adhesive 16 is apt to spread into a gap between the lead frames 17 (shown at A in FIG. 7) and a gap at the p-n junction (shown at B in FIG. 7), and liable to short-circuit the electrodes and the junction. It is therefore a problem of the existing semiconductor light emitting element that the production yield of the mounting process of the elements decreases seriously and the element is liable to deteriorate in the long-term which may cause a reliability problem.

The existing semiconductor light emitting element involves another problem that the need for a high accuracy in positional relation between the lead frames and the element inevitably decreases the productivity. This problem can be removed by increasing the element size to enlarge the distance between the lead frames 17, but it results in decreasing the number of chips obtained from a wafer and increasing the cost so much.

On the other hand, in order to decrease the forward voltage of a light emitting element, its electrodes must be in ohmic contact with the gallium nitride semiconductor layer. In existing light emitting elements, electrodes containing aluminum (Al) were used as n-side electrodes, and electrodes containing nickel (Ni) and gold (Au) were used as p-side electrodes. These electrodes, however, were not reliable in ohmic contact, and Al and Ni spread into GaN layers and degraded the reliability.

SUMMARY OF THE INVENTION

It is therefore an object of the invention to provide a nitride compound semiconductor light emitting element and its manufacturing method capable of improving the adhesive quality of electrodes to a semiconductor layer, ohmic characteristics, and external quantum efficiency by combination of a thin-film metal and a transparent electrode.

According to the invention, there is provided a nitride compound semiconductor light emitting element comprising:

an n-type semiconductor layer made of a nitride compound semiconductor; and a first metal layer formed on said semiconductor layer and containing as a major component thereof at least an element selected from the group consisting of palladium (Pd), scandium (Sc), vanadium (V), zirconium (Zr), hafnium (Hf), tantalum (Ta), rhodium (Rh), iridium (Ir), cobalt (Co) and copper (Cu).

According to the invention, by adding at least an element selected from the group consisting of titanium (Ti), nickel (Ni), molybdenum (Mo), tungsten (W) and hafnium (Hf) to the first metal layer, the contact resistance may be decreased and the adhesiveness of the electrode may be improved..

According to the invention, by forming a second metal layer between said semiconductor layer and said first metal layer, said second metal layer being made of at least an element selected from the group consisting of titanium (Ti), nickel (Ni), molybdenum (Mo), tungsten (W) and hafnium (Hf), the contact resistance may be decreased and the adhesiveness of the electrode may be improved.

According to the invention, there is also provided a nitride compound semiconductor light emitting element comprising:

an p-type semiconductor layer made of a nitride compound semiconductor; and a first metal layer formed on said semiconductor layer and containing as a major component thereof at least an element selected from the group consisting of titanium (Ti), molybdenum (Mo), tungsten (W), magnesium (Mg) and gold (Au);

a second metal layer stacked on said first metal layer and made of at least an element selected from the group consisting of titanium (Ti), nickel (Ni), molybdenum (Mo), tungsten (W), magnesium (Mg) and gold (Au); and a third metal layer stacked on said second metal layer and containing as a major element thereof at least an element selected from the group consisting of palladium (Pd), scandium (Sc), vanadium (V), zirconium (Zr), hafnium (Hf), tantalum (Ta), rhodium (Rh), iridium (Ir), cobalt (Co), copper (Cu), tungsten (W) and platinum (Pt).

That is, the nitride compound semiconductor light emitting element according to the invention is characterized in making a thin-film palladium (Pd) electrode containing titanium (Ti), nickel (Ni), and so forth, in contact with a nitride compound semiconductor layer.

For a p-type nitride compound semiconductor layer, a thin-film metal of titanium (Ti) or tungsten (W) with a thickness of 5 nm or less is applied in contact with the p-type nitride compound semiconductor layer to improve the adhesive force between the electrode and the semiconductor layer. Further, by making a thin-film metal layer, such as magnesium (Mg) layer as thin as 5 nm or less, or thin-film palladium (Pd) or platinum (Pt) layer as thin as 10 nm or less, to ensure good ohmic contact and by making a transparent electrode of ITO, for example, the sheet resistance of the thin-film electrode is reduced and uniform current injection along the emission surface is realized. Additionally, the invention is characterized in using a bonding electrode connected to a part of them.

The invention improves the adhesive force of the electrodes, their ohmic characteristics, and external quantum efficiency by combination of the thin-film metal and the transparent electrode. Since the invention does not rely on a structure where the light emitting element is mounted to orient its surface with the electrodes down ward so as to take out light from the side of the sapphire substrate, it removes various problems involved in the existing techniques, namely, short-circuit between electrodes or at the junction of different conduction type layers, serious decrease in mounting yield, deterioration in long-term reliability, and so on. Further, the invention permit the use of a cup-shaped lead frame to take out light efficiently.

According to the invention, the ohmic characteristics of both the p-side electrode and the n-side electrode in the nitride compound semiconductor light emitting element can be improved by making thin-film palladium (Pd) electrodes containing titanium (Ti), tungsten (W) and/or others in contact with a semiconductor expressed by $Al_xGa_yIn_{1-x-y}N$ ($0 \leq x \leq 1$, $0 \leq y \leq 1$, $x+y \leq 1$).

For a p-type nitride compound semiconductor layer, the adhesive force between the electrodes and the semiconductor layer can be improved by providing a thin-film metal layer of titanium, tungsten, or the like, as thin as 5 nm or less.

Further, when a thin-film metal layer like a magnesium (Mg) layer as thin as 5 nm or less, thin-film palladium (Pd) or platinum (Pt) layer as thin as 10 nm or less, or the like, is stacked, good ohmic contact is ensured.

Additionally, by stacking a transparent electrode of ITO, for example, the sheet resistance of the thin-film electrode can be reduced, and uniform current injection along the emission surface is ensured.

For an n-type nitride compound semiconductor layer, a layer of titanium (Ti), nickel (Ni), or the like, as thin as 5 nm or less provided in contact with the layer improves the adhesive force, a metal layer of palladium (Pd), for example, ensures good ohmic characteristics, and a gold (Au) layer stacked thereon reduces the resistance of the electrodes and facilitates wire bonding.

The nitride compound semiconductor light emitting element may be annealed at a temperature not higher than 500° C. to improve the adhesive force of the electrodes and reduce the contact resistance while preventing excessive reaction between the electrode metal and the semiconductor layer.

The nitride compound semiconductor light emitting element can be mounted on a standard cup-shaped lead frame to take out light efficiently.

As summarized above, the invention improves the adhesive force of the electrodes to the semiconductor layer, ohmic characteristics of the electrodes and the external quantum efficiency by combination of the thin-film metal and the transparent electrode, and it is significantly advantageous for the industry.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Explained below are embodiments of the invention with reference to the drawings.

Figure 1A:
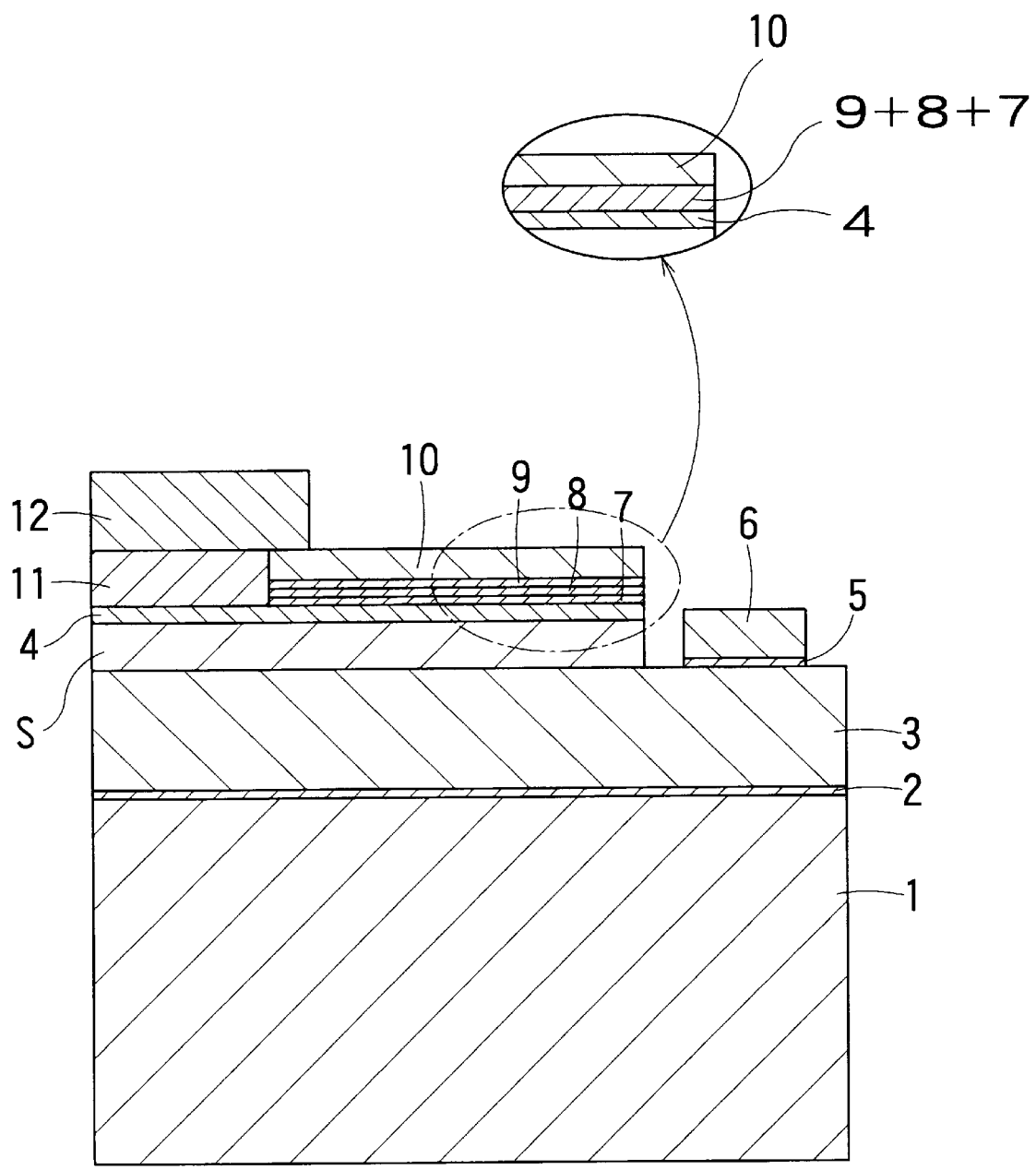
FIG. 1A is a schematic cross-sectional view showing construction of a nitride compound semiconductor light emitting element according to the first embodiment of the invention.

FIG. 1A is a schematic cross-sectional view showing construction of a nitride compound semiconductor light emitting element according to the first embodiment of the invention. The light emitting element according to the invention has a multi-layered structure including nitride semiconductor layers 2 through 4 stacked on a sapphire substrate 1. Between the n-type layer 3 and the p-type layer, a structure S including a light emitting layer is placed. The structure S may be any kind of the essential part of a light emitting element. For example, the structure S may include a double heterostructure for a LED or laser diode. A single quantum well structure or a multiple quantum well structure may also be included in the structure S. Further stacked on the p-side thereof are a p-side electrode, made up of three metal layers 7 to 9, and a transparent electrode 10, which are connected to an electrode pad 12. Provided in the n-side thereof is an n-side electrode made up of metal layers 5 and 6.

Appropriate one of the following materials is used to make the three metal layers 7 to 9 forming the p-side electrode, respectively.

The first metal layer 7 has the role of maintaining the adhesive strength between the electrode and the contact layer 4 and ensuring their ohmic contact. Used as its material is one of titanium (Ti), molybdenum (Mo), tungsten (W), magnesium (Mg) and gold (Au). Its thickness is preferably not larger than 5 nm because, with thicker layers, there was a tendency toward an increase in contact resistance and a decrease in light output caused by the increase in the optical absorption at the electrode.

The second metal layer 8 also has the role of maintaining the adhesive strength between the electrode and the contact layer 4 and ensuring their ohmic contact. Used as its material is one of titanium (Ti), nickel (Ni), molybdenum (Mo), tungsten (W), magnesium (Mg) and gold (Au). Its thickness is preferably not larger than 5 nm because, with thicker layers, there was a tendency toward an increase in contact resistance and a decrease in light output caused by the increase in the optical absorption at the electrode.

The third metal layer 9 has the role of improving the ohmic contact of the electrode with the contact layer 4. Used as its material is one of palladium (Pd), scandium (Sc), vanadium (V), zirconium (Zr), hafnium (Hf, tantalum (Ta), rhodium (Rh), iridium (Ir), cobalt (Co), copper (Cu), tungsten (W) and platinum (Pt). Its thickness is preferably not thicker than 10 nm because, with thicker layers, there was a tendency toward a decrease in light output caused by the increase in the optical absorption at the electrode.

Furthermore, by stacking the transparent electrode layer 10 on these thin-film metal layers, the sheet resistance of the electrode can be reduced significantly.

Here is shown an example using titanium (Ti) as the first metal layer 7 of the p-side electrode and magnesium (Mg) as the second metal layer.

On the other hand, the first metal layer 5 of the n-side electrode has the role of ensuring ohmic contact. Used as its material is one of palladium (Pd), scandium (Sc), vanadium (V), zirconium (Zr), hafnium (Hf), tantalum (Ta), rhodium (Rh), iridium (Ir), cobalt (Co) and copper (Cu).

The first metal layer 5 may additionally contains at least an element selected from the group consisting of titanium (Ti), nickel (Ni), molybdenum (Mo), tungsten (W) and hafnium (Hf). These additional element may improve the adhesiveness of the electrode to the n-type layer 3.

Here is explained an example using palladium (Pd) as the material of the first metal layer 5.

Gold (Au) is used as the material of the second metal layer 6 of the n-side electrode.

Figure 1B:
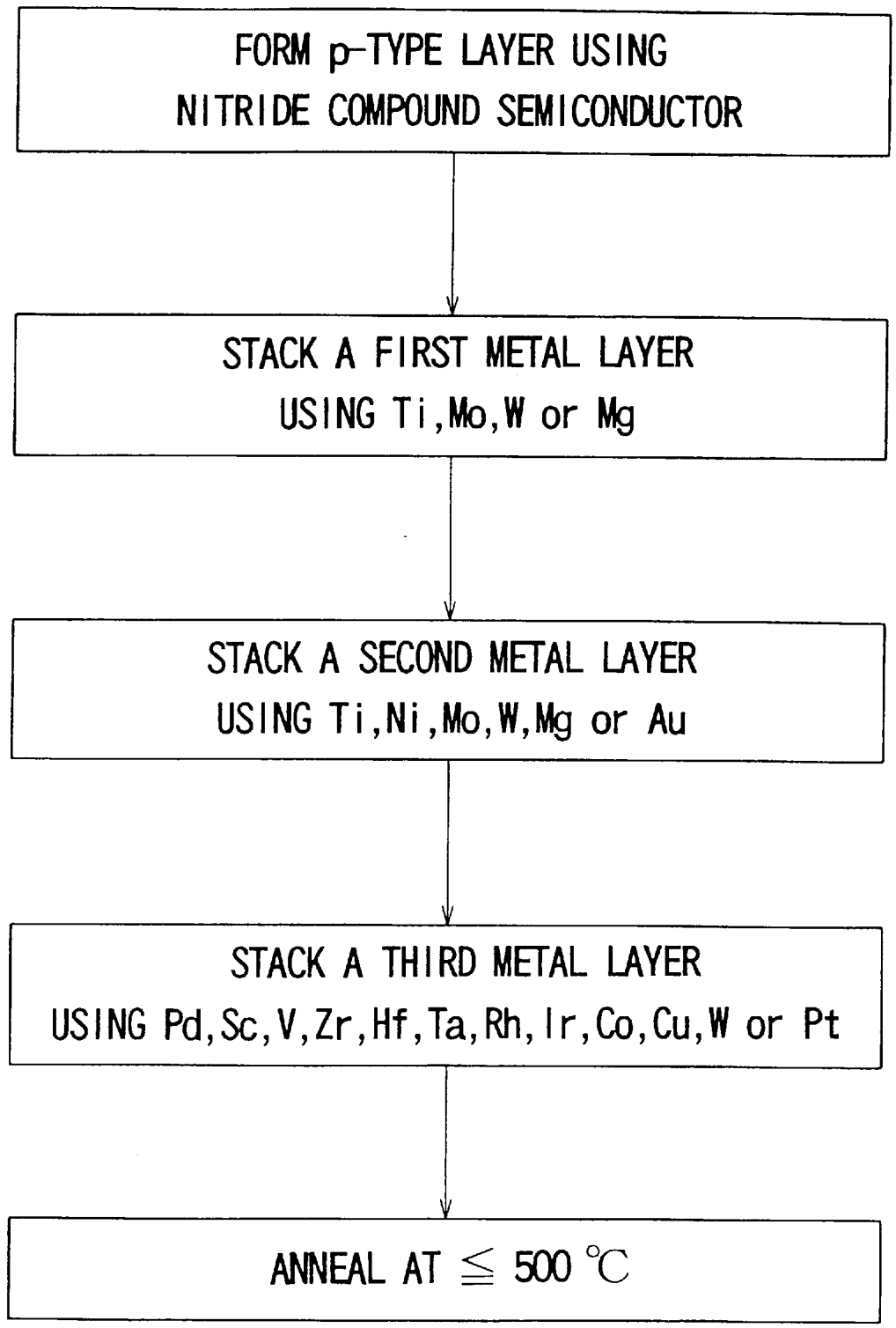
FIG. 1B shows a flow chart of the steps for forming the p-side electrode of the light emitting element of the invention.

Briefly explained below is a manufacturing process of the semiconductor light emitting element according to the embodiment. FIG. 1B shows a flow chart of the steps for forming the p-side electrode of the light emitting element of the invention.

First stacked on the sapphire substrate 1 are the GaN buffer layer 2, n-type GaN layer 3, the structure S and p-type GaN layer 4 sequentially by crystalline growth. The p-type GaN layer 4 is next patterned by PEP (photo-engraving process) and selectively removed by RIE (reactive ion etching), for example, to partly expose the n-type GaN layer 3.

After another patterning by PEP, the palladium (Pd) film 5 and the gold (Au) film 6, for example, are stacked as the n-side electrode on the n-type GaN layer 3 by vapor deposition, and then patterned by lift-off.

After another patterning by PEP, vacuum evaporation is conducted to sequentially stack on the p-type GaN layer 4 the titanium (Ti) layer 7 with the thickness of 1 nm, magnesium (Mg) layer 8 with the thickness of 1 nm and Pd electrode 9 with the thickness of 10 nm, and after making an indium tin oxide (ITO) film 10 by RF sputtering, they are patterned by a lift-off process.

After that, for the purpose of improving the adhesiveness between the p-side thin-film electrode and the semiconductor layer and their ohmic characteristics and for improving the ohmic characteristics of the n-side electrode, a annealing is conducted.

The annealing may alloy the electrode metals, but excessive reaction between the semiconductor layer and the electrode metals is not desirable. Therefore, the annealing temperature is preferably not higher than 500° C.

Preferably a flush-annealing is conducted under 450° C. for 20 seconds, approximately. By the flush-annealing, the metal layers 7–9 may be alloyed as shown in FIG. 1A in a fragmentary alternative view. If, however, the surface of the semiconductor layer is sufficiently clean without any oxide layer, or the like, the flush-annealing may be omitted.

Then after making a $SiO_2$ film 11 by thermal CVD, patterning by PEP is conducted to make a pattern in a location for a p-side bonding pad 12. After another patterning by PEP, followed by lift-off to make the bonding pad 12 of a metal film of Ti/Au, for example, to lie on the p-side transparent electrode (ITO) 10 and the $SiO_2$ film 11, the light emitting element is completed.

Figure 2:
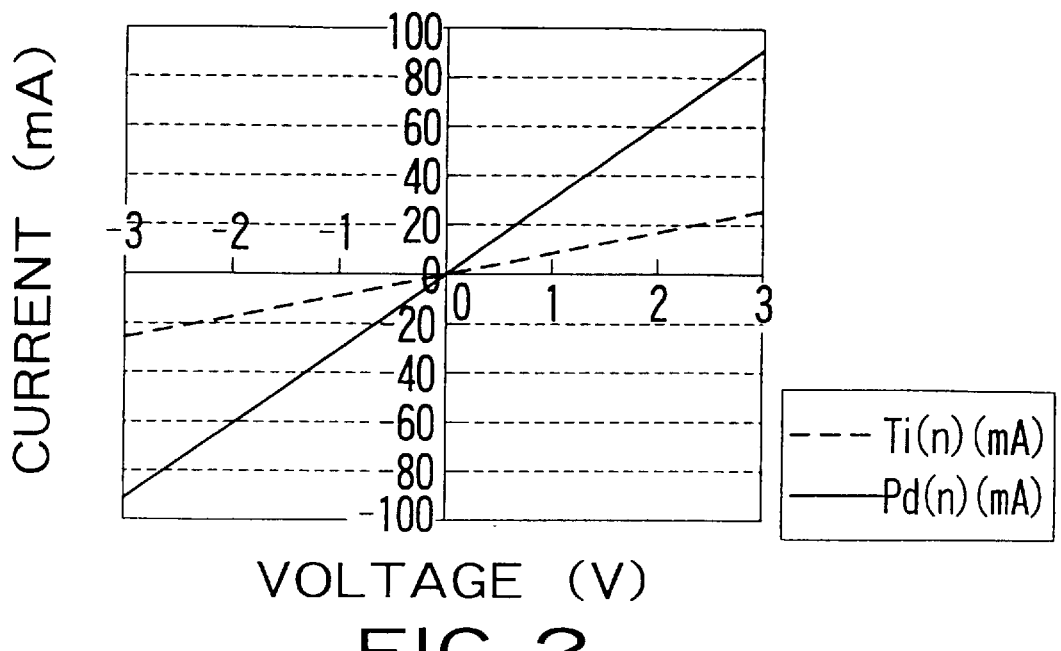
FIG. 2 is a graph showing current-voltage characteristics of the site of an n-side electrode in the light emitting element according to the invention.

FIG. 2 is a graph showing current-voltage characteristics of the n-side electrode portion of the light emitting element thus obtained. FIG. 2 comparatively shows values with the palladium/gold multilayered electrode according to the invention (solid line) and values with a titanium/gold multilayered electrode according to an existing technique (broken line). It has been confirmed from FIG. 2 that the element according to the invention, using palladium as the n-side electrode, exhibits good ohmic characteristics and decreases in contact resistance to approximately ¼ that of the existing electrode.

Figure 3:
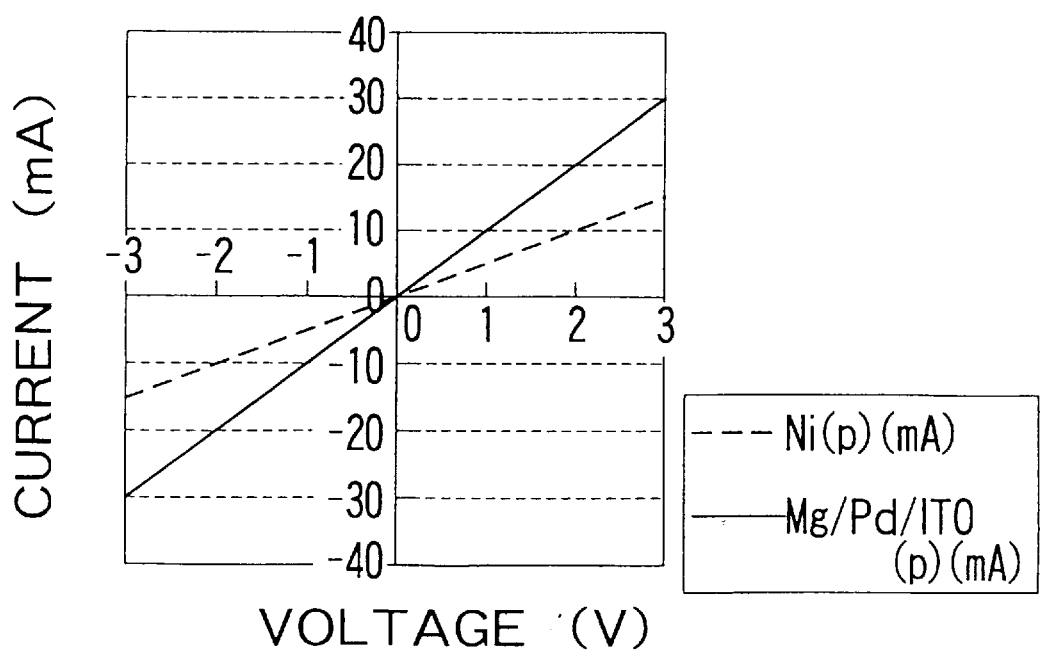
FIG. 3 is a graph showing current-voltage characteristics of the site of a p-side electrode in the light emitting element according to the invention.

FIG. 3 is a graph showing current-voltage characteristics of the p-side electrode portion of the light emitting element according to the invention. FIG. 3 comparatively shows values with the magnesium/palladium/ITO multi-layered electrode according to the invention (solid line) and values with a nickel/gold multi-layered electrode according to an existing technique (broken line). It has been confirmed from FIG. 3 that the element according to the invention exhibits good ohmic characteristics and decreases in contact resistance to approximately a half that of the existing element.

Even after gold wires were bonded to the n-side electrode and the p-side electrode, respectively, the electrodes were confirmed to be in place with a sufficiently high adhesive strength, without peeling off.

The light emitting element according to the invention actually exhibited good characteristics, namely, forward voltage 3.4 V and optical output 91 $\mu$W in response to the current of 20 mA. Moreover, variance of I-V characteristics and optical output within the wafer plane was very small, and a high production yield of elements was confirmed.

Next explained the second embodiment of the invention.

Figure 4:
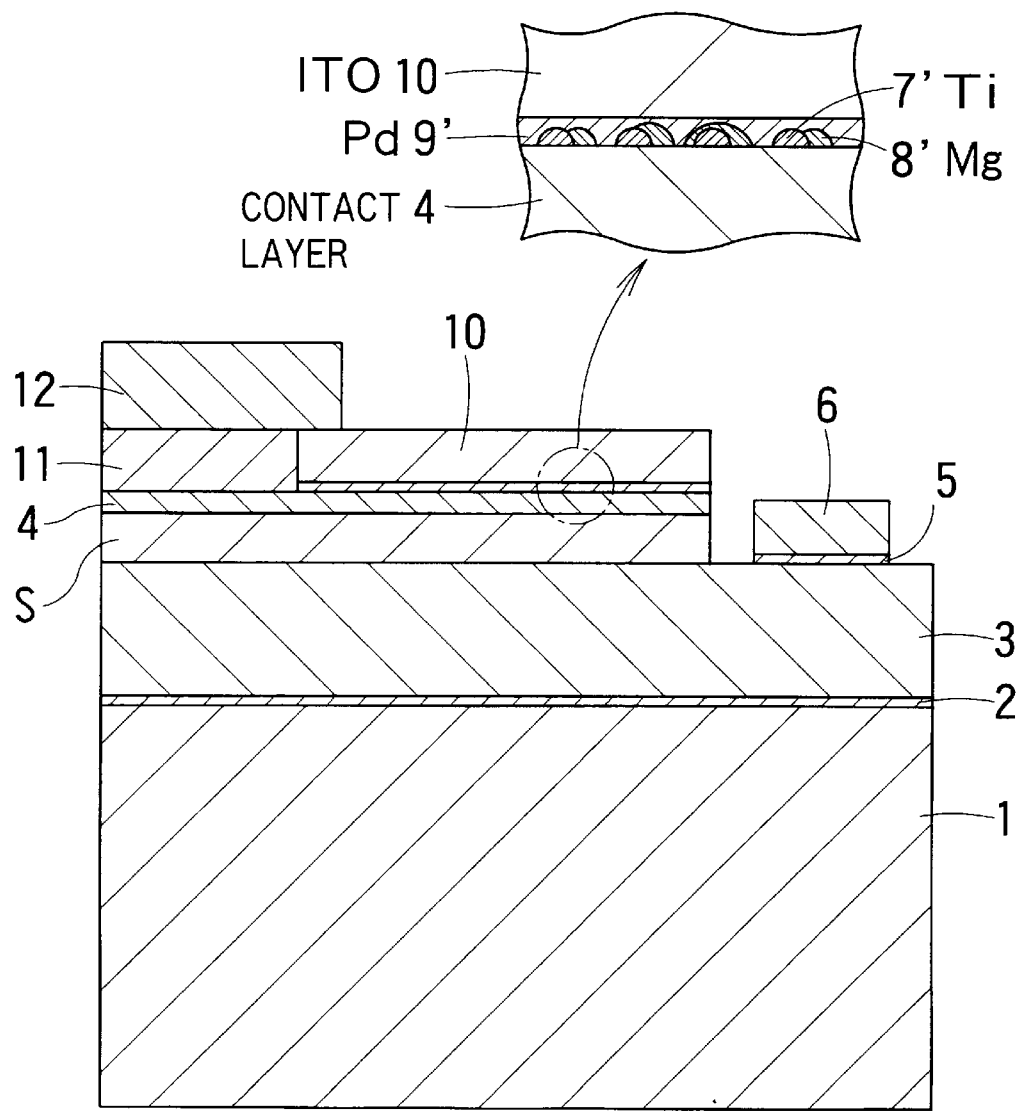
FIG. 4 is a schematic cross-sectional view showing construction of a nitride compound semiconductor light emitting element according to the second embodiment of the invention.

FIG. 4 is a schematic cross-sectional view showing construction of a nitride compound semiconductor light emitting element taken as the second embodiment of the invention. Here again, the light emitting element has a multilayered structure including nitride semiconductor layer 2 through 4 and the structure S stacked on the sapphire substrate 1. Further stacked in the p-side of the element are the p-side electrode and the transparent electrode 10 connected to the electrode pad 12. Formed in the n-side of the element is the n-side electrode made up of the metal layers 5 and 6. The same portions as those of the first embodiment are labeled with common reference numerals, and their detailed explanation is omitted.

In the embodiment shown here, the first metal layer 7 and the second metal layer 8 are stacked for making the p-side electrode as they are in the first embodiment, but much thinner so that they may form the islands. Here is shown an example using titanium (Ti) as the first metal layer and magnesium (Mg) as the second metal layer.

That is, in the second embodiment, a 2 nm thick titanium (Ti) layer 7', 2 nm thick magnesium (Mg) layer 8' and 50 nm thick palladium (Pd) layer 9' are stacked to form the p-side electrode. These thicknesses are the average values. In this case where titanium and magnesium are stacked very thin, the films may fails to become continuous thin films, and often become island-shaped on the contact layer 4 as shown in FIG. 4 in a fragmentary enlarged view. That is, the first metal layer 7' and the second metal layer 9' are island-shaped, respectively. The inventor has found that the average thickness should be smaller than 10 nm to realize such an island-shaped distribution of the metal layers.

Annealing may be conducted after stacking these metal layers, but annealing need not be done if a sufficiently clean condition is ensured between the semiconductor layer and the electrode metals. Annealing may alloy the electrode metals, but excessive reaction between the semiconductor layer and the electrode metals is not desirable. Therefore, the annealing temperature is preferably not higher than 500° C.

Also when the first metal layer and the second metal layer are stacked very thin to make the p-side electrode, the adhesive strength is acceptable, and good ohmic characteristics and a low contact resistance are realized. Probably, this is a result of successfully maintaining the function of the first and second metal layers to improve the adhesive strength and the function of the third metal layer to ensure ohmic characteristics.

Next explained is the third embodiment of the invention.

Figure 5A:
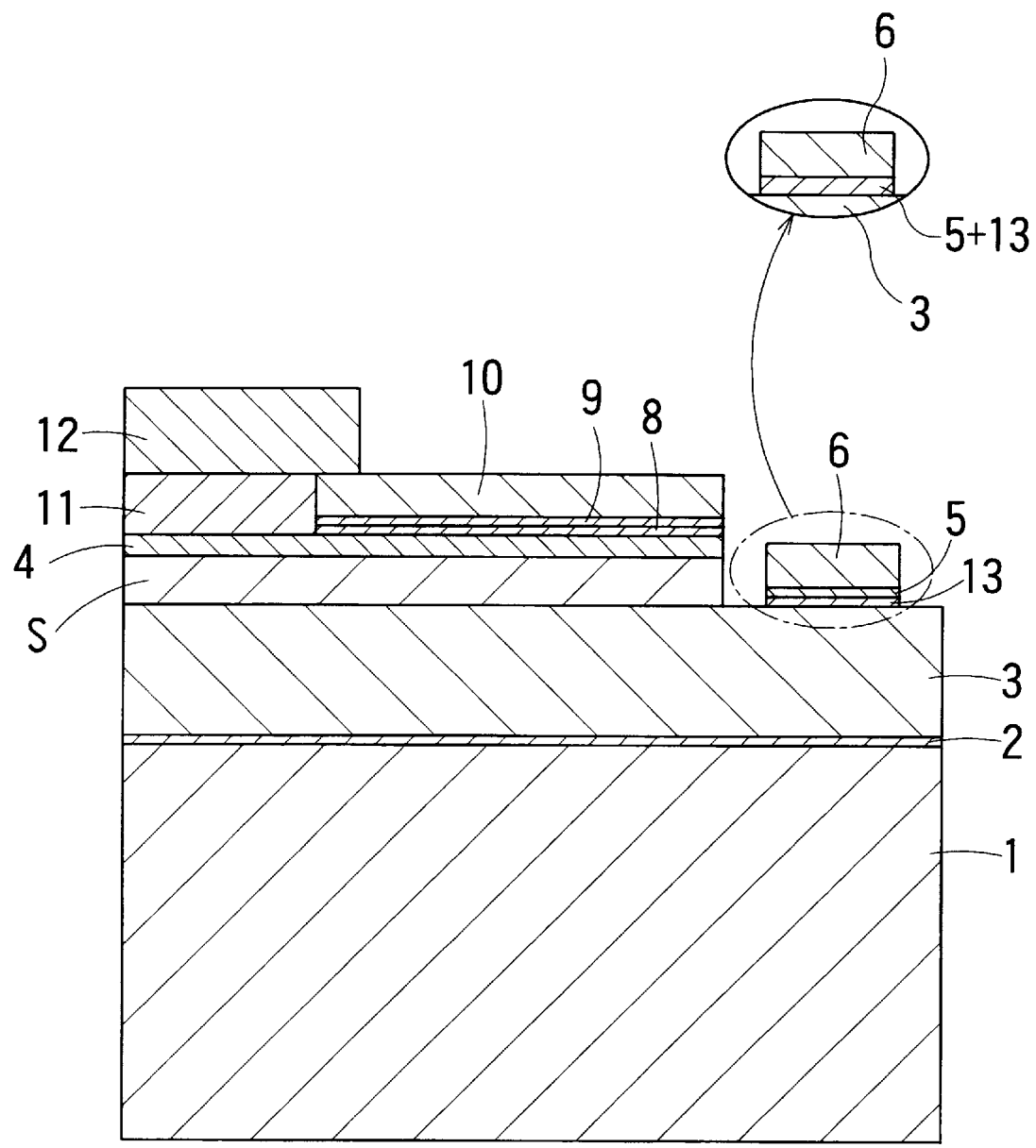
FIG. 5A is a schematic cross-sectional view showing construction of a nitride compound semiconductor light emitting element according to the second embodiment of the invention.

FIG. 5A is a schematic cross-sectional view showing construction of a nitride compound semiconductor light emitting element taken as the third embodiment of the invention. Here again, the light emitting element has a multi-layered structure including nitride semiconductor layer 2 through 4 and the structure S stacked on the sapphire substrate 1. The same portions as those of the first embodiment are labeled with common reference numerals, and their detailed explanation is omitted.

In the embodiment shown here, stacked in the p-side of the element are a first metal layer 8, second metal layer 9 and transparent electrode 10. Used as the material of the first metal layer 8 is one of titanium (Ti), molybdenum (Mo), tungsten (W), magnesium (Mg) and gold (Au).

Used as the material of the second metal layer 9 is one of palladium (Pd), scandium (Sc), vanadium (V), zirconium (Zr), hafnium (Hf), tantalum (Ta), rhodium (Rh), iridium (Ir), cobalt (Co), copper (Cu), platinum (Pt) and tungsten (W).

Here is shown an example using magnesium (Mg) as the first metal layer 8 of the p-side electrode, palladium (Pd) as the second metal layer 9 and ITO as the transparent electrode 10.

Figure 5B:
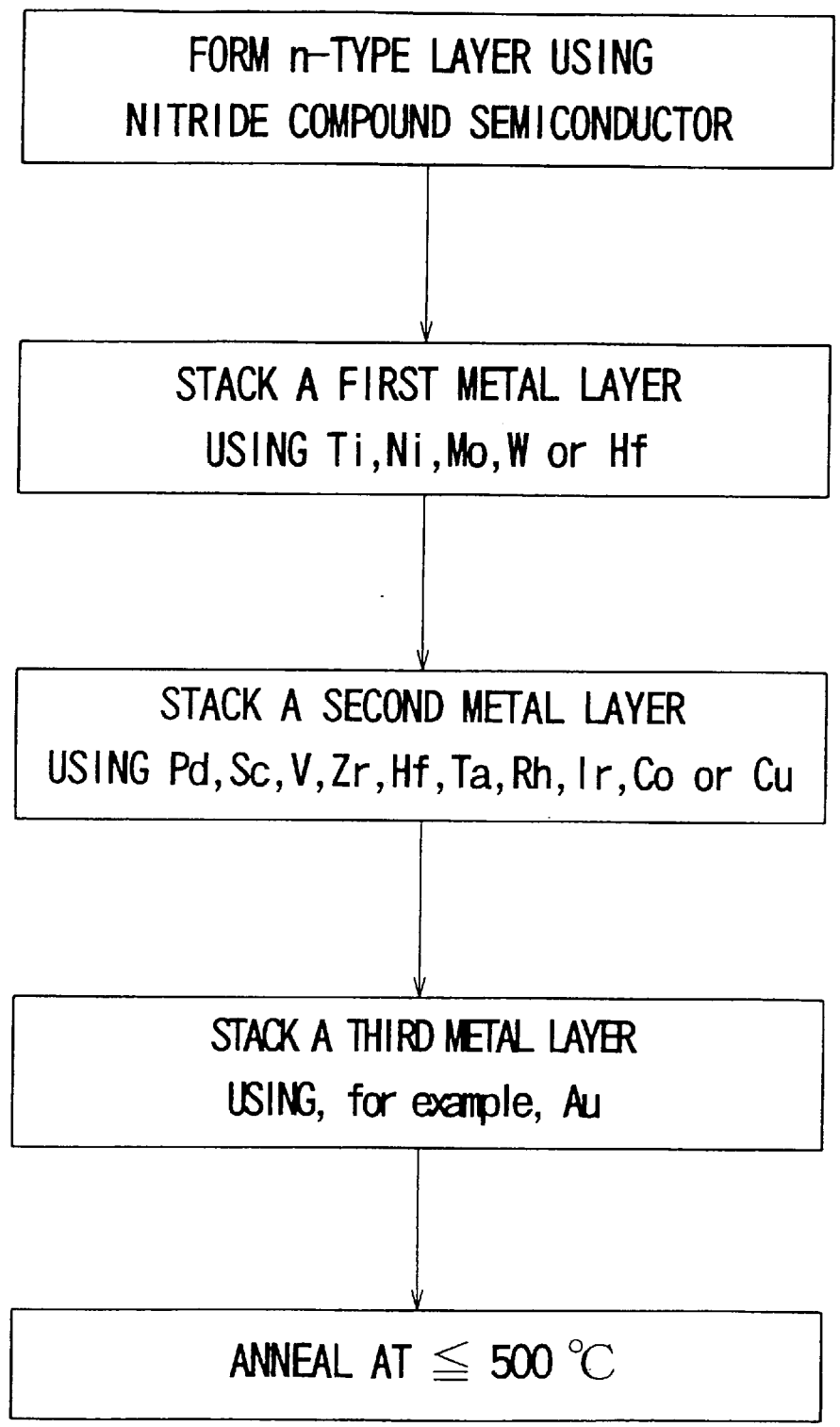
FIG. 5B shows a flow chart of the steps for forming the n-side electrode of the light emitting element of the invention.

FIG. 5B shows a flow chart of the steps for forming the n-side electrode of the light emitting element of the invention.

Formed in the n-side of the element is a three-layered electrode made up of a first metal layer 13, second metal layer 5 and third metal layer 6.

The first metal layer 13 of the n-side electrode has the role of ensuring an adhesive strength of the electrode with the contact layer 3. Used as its material is one of titanium (Ti), nickel (Ni), molybdenum (Mo), tungsten (W) and hafnium (Hf). Its thickness is preferably not larger than 5 nm because, with larger thicknesses, there was a tendency toward an increase in contact resistance and a decrease in adhesive strength of the electrode.

The second metal layer 5 of the n-side electrode has the role of ensuring ohmic contact. Used as its material is one of palladium (Pd), scandium (Sc), vanadium (V), zirconium (Zr), hafnium (Hf), tantalum (Ta), rhodium (Rh), iridium (Ir), cobalt (Co) and copper (Cu).

Used as the third metal layer 6 of the n-side electrode is gold (Au).

Annealing may alloy the electrode metals, but excessive reaction between the semiconductor layer and the electrode metals is not desirable. Therefore, the annealing temperature is preferably not higher than 500° C. By the annealing, the metal layers 5, 13 may be alloyed as shown in FIG. 5A in a fragmentary alternative view.

Here is taken an example using titanium (Ti) as the first metal layer 13 of the n-side electrode and palladium (Pd) as the second metal layer 5.

Even in the case where the magnesium layer 8 and the palladium layer 9 are stacked on the contact layer 4 in the p-side whilst the titanium layer 13 and the palladium layer 5 are stacked on the contact layer 4 in the n-side, good ohmic characteristics and a low contact resistance are realized in both the p-side and the n-side.

The invention has been explained above by way of embodiments referring to specific examples. The invention, however, is not limited to these specific examples. For instance, these specific examples have been explained as using magnesium (Mg), titanium (Ti), palladium (Pd) or gold (Au) as the electrode material, ITO as the transparent electrode, and GaN as the semiconductor layer, but other appropriate materials are also usable. According to the invention, by using those metals or their alloys as the first metal layer and the second metal layer in the p-side and the n-side, respectively, substantially the same effects can be obtained.

These electrodes need not be two-layered or three-layered like those in the above-explained embodiments, but may be of any multi-layered structure made up of four or more layers using appropriate ones of the above-mentioned metals.

Usable as the transparent electrode are, in addition to ITO indicated above, tin oxide and any appropriate one stacking a metal such as gold (Au) very thin.

Construction of the light emitting element may alternately be any using nitride compound semiconductors in locations for contact with the electrodes, and it is equally applicable to light emitting diodes and semiconductor lasers with various structures.

For example, if the layers of nitride compound semiconductor are formed on the top surface of an electrically conductive substrate, one electrode may be formed on the top of the nitride compound semiconductor layer and the another electrode may be formed on the bottom surface of the conductive substrate. The invention may be applicable to such a case and works as well. As the conductive substrate, GaN, SiC, GaAs and Si may be employed.

According to the invention, the element can be mounted on a standard cup-shaped lead frame, and light can be taken out efficiently.

Figure 6:
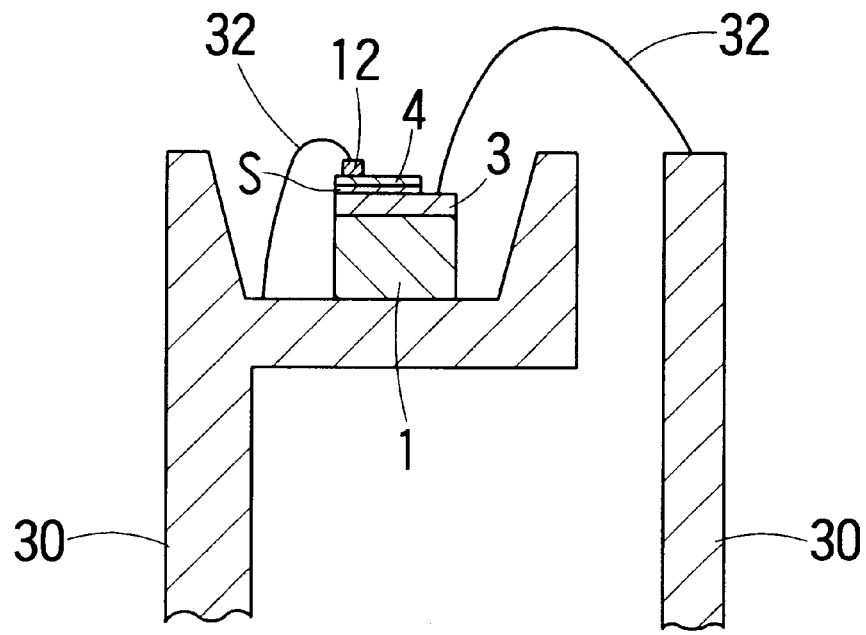
FIG. 6 is a diagram schematically showing a semiconductor emitting element according to the invention mounted on lead frames.
Figure 7:
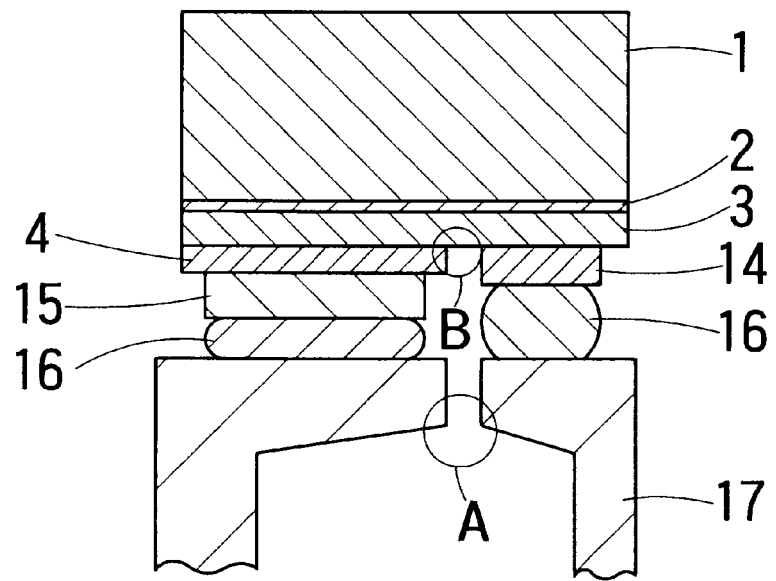
FIG. 7 is a schematic diagram showing construction of an existing nitride compound semiconductor light emitting element.

FIG. 6 is a schematic diagram showing a semiconductor light emitting element according to the invention mounted on a lead frame. The semiconductor light emitting element according to the invention is mounted on a cup-shaped lead frame 30 and connected by wires 32, 32. Here is shown the semiconductor light emitting element, omitting illustration of the detailed aspect of the electrodes.

As shown in FIG. 6, the invention makes it easy to realize a light emitting device ensuring a high emission luminance, economically by using widely available cup-shaped lead frames.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No. 10-77477 filed on Mar. 25, 1998 including specification, claims, drawings and summary is incorporated herein by reference in its entirety.

What is claimed is:

1. A nitride compound semiconductor light emitting element comprising:
    an n-type semiconductor layer made of a nitride compound semiconductor; and
    a first metal layer formed on said semiconductor layer and containing as a major component thereof at least an element selected from the group consisting of palladium (Pd), scandium (Sc), vanadium (V), zirconium (Zr), hafnium (Hf), tantalum (Ta), rhodium (Rh), iridium (Ir), cobalt (Co) and copper (Cu).

2. The nitride compound semiconductor light emitting element as recited in claim 1, wherein said first metal layer additionally contains at least an element selected from the group consisting of titanium (Ti), nickel (Ni), molybdenum (Mo), tungsten (W) and hafnium (Hf).

3. The nitride compound semiconductor light emitting element as recited in claim 1, further comprising a second metal layer formed between said semiconductor layer and said first metal layer, said second metal layer being made of at least an element selected from the group consisting of titanium (Ti), nickel (Ni), molybdenum (Mo), tungsten (W) and hafnium (Hf).

4. The nitride compound semiconductor light emitting element as recited in claim 3, wherein said second metal layer is not thicker than 5 nm.

5. The nitride compound semiconductor light emitting element as recited in claim 3, wherein said first metal layer and said second metal layer are alloyed each other.

6. A nitride compound semiconductor light emitting element comprising:
    an p-type semiconductor layer made of a nitride compound semiconductor;
    a first metal layer formed on said semiconductor layer and containing as a major component thereof at least an element selected from the group consisting of titanium (Ti), molybdenum (Mo), tungsten (W), magnesium (Mg) and gold (Au);
    a second metal layer stacked on said first metal layer and made of at least an element selected from the group consisting of titanium (Ti), nickel (Ni), molybdenum (Mo), tungsten (W), magnesium (Mg) and gold (Au); and
    a third metal layer stacked on said second metal layer and containing as a major element thereof at least an element selected from the group consisting of palladium (Pd), scandium (Sc), vanadium (V), zirconium (Zr), hafnium (Hf), tantalum (Ta), rhodium (Rh), iridium (Ir), cobalt (Co), copper (Cu), tungsten (W) and platinum (Pt).

7. The nitride compound semiconductor light emitting element as recited in claim 6, further comprising a transparent electrode formed on said third metal layer.

8. The nitride compound semiconductor light emitting element as recited in claim 7, wherein said first metal layer is not thicker than 5 nm, said second metal layer is not thicker than 5 nm and said third metal layer is not thicker than 10 nm.

9. The nitride compound semiconductor light emitting element as recited in claim 8, wherein said first metal layer, said second metal layer and said third metal layer are alloyed each other.

10. The nitride compound semiconductor light emitting element as recited in claim 9, wherein said transparent electrode is made of an indium tin oxide.

11. The nitride compound semiconductor light emitting element as recited in claim 7, wherein said first metal layer is island-shaped on said semiconductor layer and said second metal layer is island-shaped on said semiconductor layer or on said first metal layer.

12. The nitride compound semiconductor light emitting element as recited in claim 11, wherein said first metal layer is not thicker than 1 nm and said second metal layer is not thicker than 1 nm.

* * * * *